(12) United States Patent
Lin

(10) Patent No.: US 7,589,977 B2
(45) Date of Patent: Sep. 15, 2009

(54) HOUSING COMBINATION FOR PORTABLE ELECTRONIC DEVICE

(75) Inventor: Shih-Chieh Lin, Tu-Cheng (TW)

(73) Assignee: Chi Mei Communication Systems, Inc., Tu-Cheng, Taipei County (TW)

( * ) Notice: Subject to any disclaimer, the term of this patent is extended or adjusted under 35 U.S.C. 154(b) by 0 days.

(21) Appl. No.: 11/961,332

(22) Filed: Dec. 20, 2007

(65) Prior Publication Data

US 2009/0073671 A1   Mar. 19, 2009

(30) Foreign Application Priority Data

Sep. 19, 2007   (CN) .......................... 2007 1 0201762

(51) Int. Cl.
*H05K 9/00* (2006.01)

(52) U.S. Cl. .................. 361/816; 361/800; 361/818; 361/737; 361/802; 174/350

(58) Field of Classification Search ................ 361/753, 361/799, 800, 816, 818, 737, 756, 741, 802; 174/350; 439/945, 946; 235/492
See application file for complete search history.

(56) References Cited

U.S. PATENT DOCUMENTS

| | | | | |
|---|---|---|---|---|
| 5,336,877 | A  * | 8/1994 | Raab et al. | 235/475 |
| 5,699,406 | A  * | 12/1997 | Liikanen et al. | 455/558 |
| 6,075,706 | A  * | 6/2000 | Learmonth et al. | 361/737 |
| 6,421,246 | B1 * | 7/2002 | Schremmer | 361/737 |
| 6,563,715 | B2 * | 5/2003 | Villain et al. | 361/800 |
| 6,766,952 | B2 * | 7/2004 | Luu | 235/451 |
| 7,093,764 | B1 * | 8/2006 | Valenzuela et al. | 235/486 |
| 7,280,846 | B2 * | 10/2007 | Lin | 455/558 |
| 2003/0227763 | A1* | 12/2003 | Kao et al. | 361/818 |
| 2005/0231932 | A1* | 10/2005 | Nestor et al. | 361/818 |

* cited by examiner

*Primary Examiner*—Dameon E Levi
(74) *Attorney, Agent, or Firm*—Steven M. Reiss

(57) ABSTRACT

A housing combination includes a housing (51) and a shielding enclosure (55). The housing has a peripheral wall and a receiving hole (511). The peripheral wall surrounds the receiving hole configured for receiving a surface contact card. A guiding element (52) is positioned in at least one part of the peripheral wall of the receiving hole. The shielding enclosure is disposed at one side of the housing, one part of the shielding enclosure exposed from the receiving hole configured for supporting the surface contact card.

7 Claims, 5 Drawing Sheets

HOUSING COMBINATION FOR PORTABLE ELECTRONIC DEVICE

BACKGROUND OF THE INVENTION

1. Field of the Invention

The present invention relates to housing combinations for a portable electronic device, particularly to a housing combination that may effectively utilize an inner space of the portable electronic device.

2. Discussion of the Related Art

With the development of wireless communication and information processing technologies, portable electronic devices such as mobile phones are now in widespread use. These electronic devices enable consumers to enjoy high-tech services almost anytime and anywhere.

Referring now to FIGS. 4-5, a conventional housing combination 20 includes a housing 21 and a printed circuit board 23. The housing 21 is substantially rectangular, and is made of plastics. A mounting section 211 is disposed in a back of the housing 21. The mounting section 211 includes a support portion 214 and several guiding surfaces 215. The support portion 214 is recessed downward relative to the housing 21 configured for providing a suitable strength to support a subscriber identification module (SIM) card. The guiding surfaces 215 are slantways connected between the support portion 214 and the housing 21. A receiving hole 216 communicates with the housing 21, and is adjacent to the support portion 214. The printed circuit board 23 is disposed below the housing 21. A SIM card connector 232 is electrically connected to the printed circuit board 23. The position of the SIM card connector 232 corresponds to that of the receiving hole 216. When the printed circuit board 23 is assembled with the housing 21, the SIM card connector 232 of the printed circuit board 23 is exposed from the receiving hole 216, thereby the support portion 214 with the SIM card connector 232 together defining a space for receiving the SIM card.

Since the housing 21 is made of plastics, the support portion 214 of the housing 21 needs to provide enough thickness so as to secure the strength of the support portion 214, thus the support portion 214 will occupy more inside space of the portable electronic device. Accordingly, the space in the portable electronic device is not fully used.

Therefore, an improved housing combination is desired in order to overcome the above-described shortcoming.

SUMMARY OF THE INVENTION

One embodiment of the present housing combination includes a housing and a shielding enclosure. The housing has a peripheral wall and a receiving hole. The peripheral wall surrounds the receiving hole configured for receiving a surface contact card. The guiding element is positioned in at least one part of the peripheral wall of the receiving hole. The shielding enclosure is disposed at one side of the housing and one part of the shielding enclosure is exposed from the receiving hole configured for supporting the surface contact card.

Other advantages and novel features of the present housing combination will become more apparent from the following detailed description thereof when taken in conjunction with the accompanying drawings.

BRIEF DESCRIPTION OF THE DRAWINGS

Many aspects of the housing combination can be better understood with reference to the following drawings. The components in the drawings are not necessarily drawn to scale, the emphasis instead being placed upon clearly illustrating the principles of the present housing combination. Moreover, in the drawings, like reference numerals designate corresponding parts throughout the several views, in which.

DETAILED DESCRIPTION OF THE INVENTION

Figure 1:
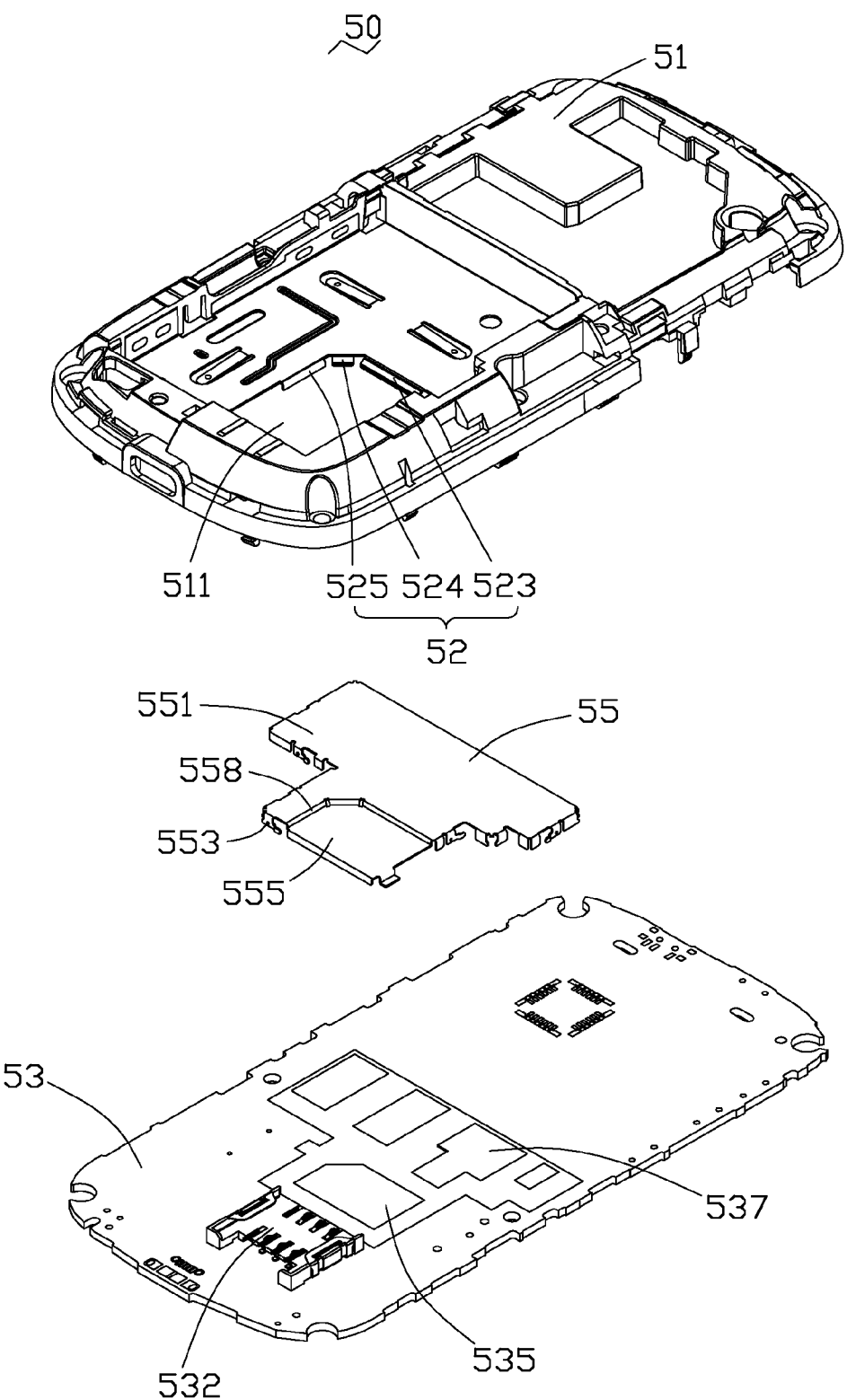
FIG. 1 is an exploded, schematic view of a preferred embodiment of the present housing combination.
Figure 2:
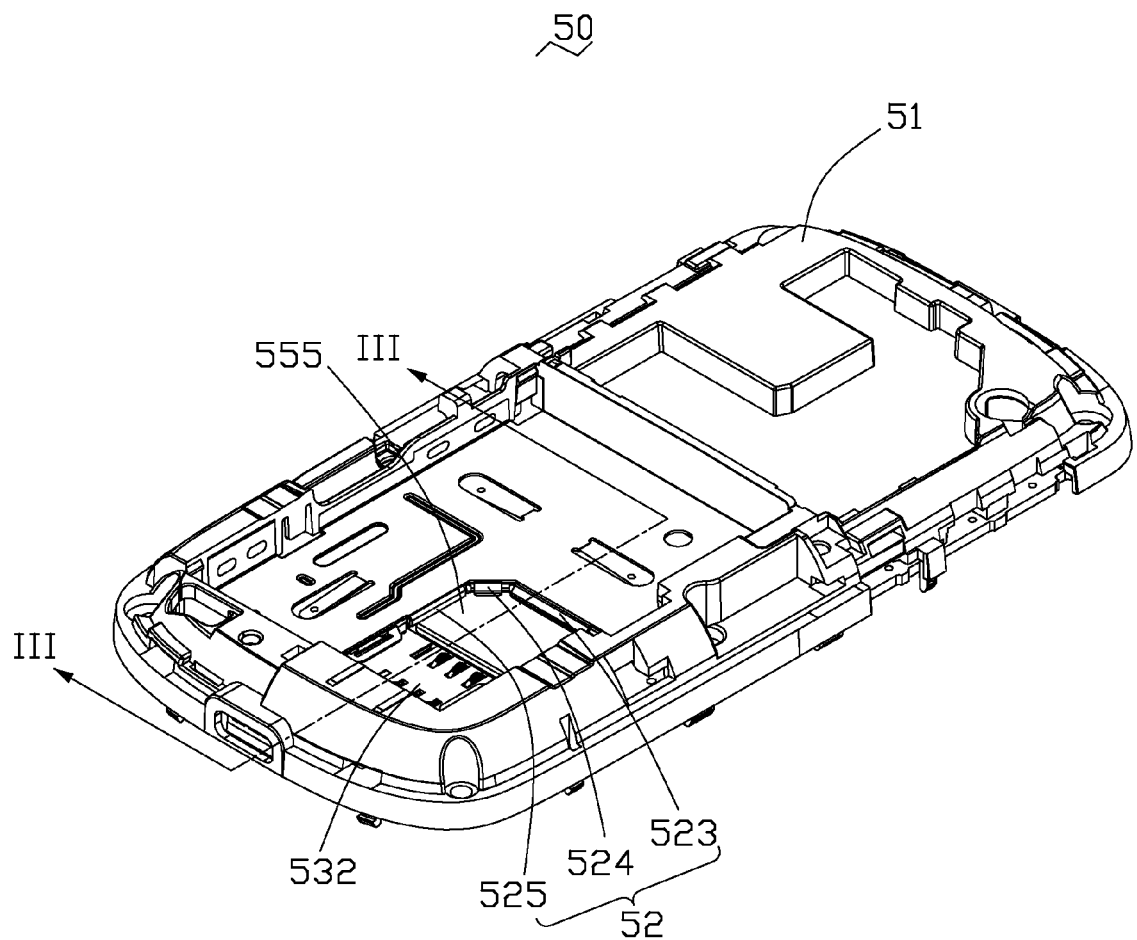
FIG. 2 is an assembled, schematic view of FIG. 1.

Referring to FIGS. 1 and 2, the present housing combination 50, in one illustrated embodiment, is applied in a portable electronic device such as mobile phone or personal digital assistant (PDA). The housing combination 50 includes a housing 51, a metal piece 52, a printed circuit board 53 and a shielding enclosure 55.

The housing 51 is substantially rectangular, and is made of plastic. The housing 51 defines a receiving hole 511 in a substantially right corner position. The shape of the receiving hole 511 is similar to that of SIM card configured for receiving a surface contact card such as SIM card, secure digital card (SD) and so on.

The metal piece 52 is extended from one part of a peripheral wall of the receiving hole 511 of the housing 51. The metal piece 52 includes a first guiding flange 523, a second guiding flange 524 and a third guiding flange 525 adjacent to each other. The above guiding flange 523, 524, 525 are integrally formed with the housing 51 by insert-molding method. Each guiding flange 523, 524, 525 is tilted with the peripheral wall of the receiving hole 511, allowing the SIM card to be easily removed from the receiving hole 511. The guiding flanges 523, 524, 525 of the metal piece 52 shown herein for illustrative purposes is rectangular, however, any shape such as square or irregular shape may be used.

The printed circuit board 53 is disposed below the housing 51, and the shape of the printed circuit board 53 corresponds with the shape of the housing 51. The printed circuit board 53 includes a SIM card connector 532, a first function area 535 and a second function area 537. The SIM card connector 532 is adjacent to the first function area 535. The first function area 535 with the second function area 537 together forms a T-shape, used for disposing electronic elements and function modules. When the printed circuit board 53 is assembled to the housing 51, the SIM card connector 532 and the first function area 532 may be exposed from the receiving hole 511 of the housing 51.

The shielding enclosure 55 is substantially T-shape in shape to correspond to the first function area 535 and the second function area 537 described generally above. As previously discussed with respect to the first function area 535 and the second function area 537, the shielding enclosure 55 may be configured in a shape other than T-shape. The shielding enclosure 55 includes a cover 551 and a plurality of flange edges 553 perpendicularly bended downward therefrom. The shielding enclosure 55 is configured for shielding one or more electric or electronic components on the printed circuit board 53 in order to reduce the electromagnetic interference with adjacent components. The cover 551 is recessed downward in the position corresponding to the first function area 535, thereby forming a support portion 555. When the shielding enclosure 55 is fixed on the printed circuit board 53, a thickness of the support portion 555 relative to the printed circuit board 53 is substantially equal to that of the SIM card connector 535. The support portion 555 with the cover 551 is connected with three connecting walls 558. The shape of the connecting walls 558 is corresponding to that of the flange edges 523, 524, 525. When the shielding enclosure 55 is fixed on the printed circuit board 53 below the housing 51, the SIM card connector 532 and the support portion 555 are exposed from the receiving hole 511 of the housing 51. At the same time, the flange edges 523, 524, 525 resist on the connecting walls 558.

Figure 3:
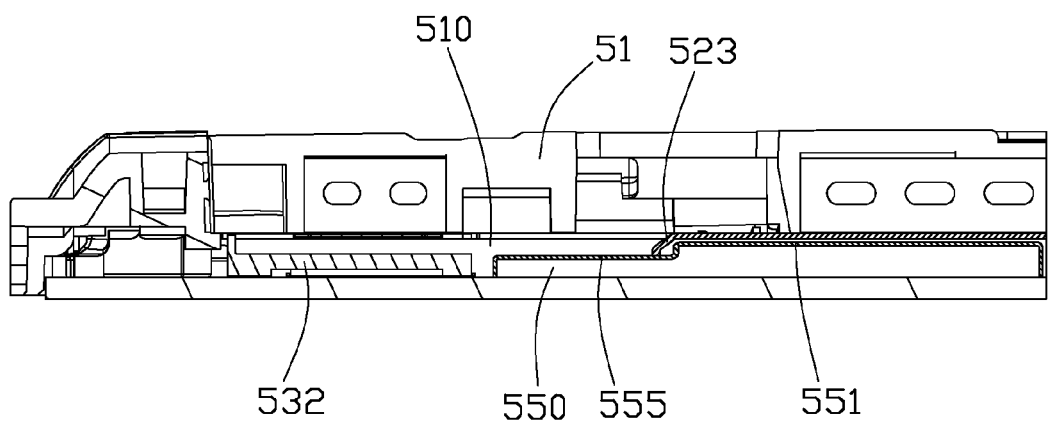
FIG. 3 is a partially cross-sectional view along III-III line of FIG. 2 thereof.
Figure 4:
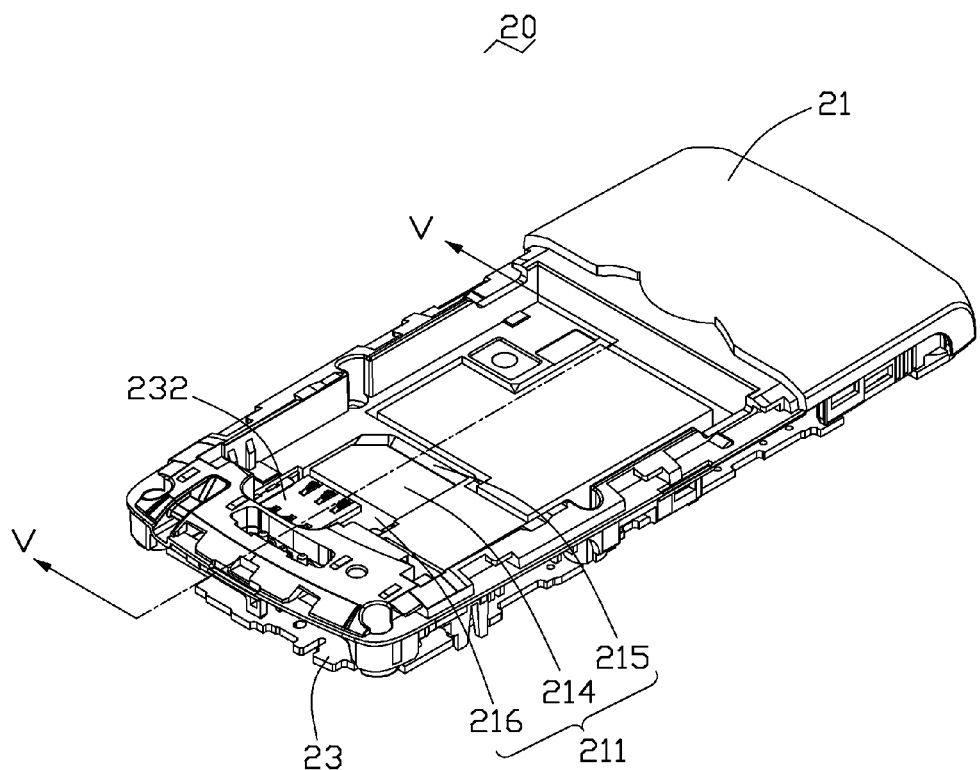
FIG. 4 is a schematic view of a conventional housing combination.
Figure 5:
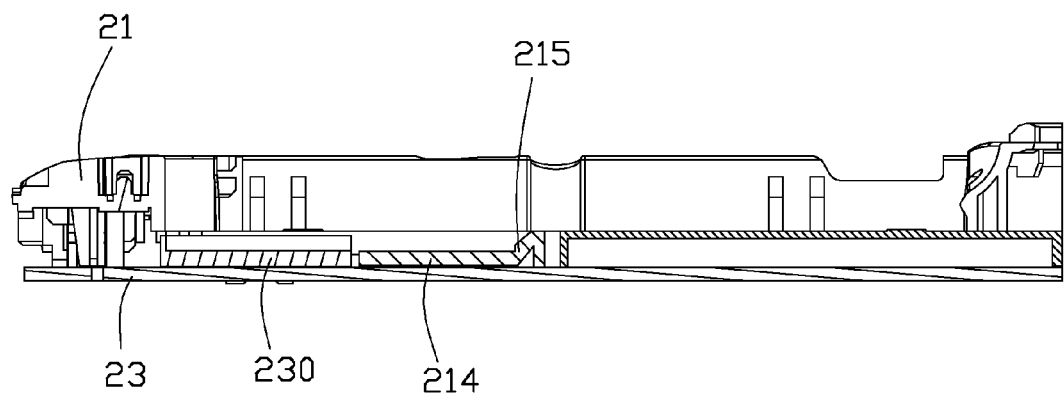
FIG. 5 is a partially cross-sectional view along V-V line of FIG. 4 thereof.

In assembly, the shielding enclosure 55 is firstly fixed on the printed circuit board 53 by soldering/welding and covers the first function area 535 and the second function area 537. The support portion 555 is basically coplanar with the SIM card connector 532. After that, the printed circuit board 53 with the shielding enclosure 55 together is assembled into the housing 51. Accordingly, the SIM card connector 532 and the support portion 555 of the shielding enclosure 55 are exposed from the receiving hole 511. The connecting walls 558 resist the guiding flanges 523, 524, 525. Referring to FIG. 3, the metal piece 52, the support portion 555 and the SIM card connector 532 cooperatively defines a receiving cavity 510 for receiving a SIM card. When the SIM card is placed in the receiving cavity 510, the SIM card not only directly contact the SIM card connector, but also is effectively supported by the support portion 555.

A main advantage of the housing combination is that the support portion is replaced with one part of the shielding enclosure so that the support portion does not be need to be extra provided. Therefore, the shielding enclosure not only shields the electronic components on the printed circuit board, but also supports the SIM card. In addition, the shielding enclosure directly function as the support portion. This may allow the distance between the housing and the printed circuit board to be reduced, thereby effectively utilizing the inner space of the portable electronic device.

It is to be understood that the metal piece 52 functioning as a guiding element may be formed with the housing 51 by other methods other than insert-molding. It is also to be understood that the metal piece 52 may be integrally formed with the shielding enclosure 55.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A housing combination comprising:
   a housing having a peripheral wall and a receiving bole, the peripheral wall surrounding the receiving hole, the receiving hole receiving a surface contact card, a guiding element being positioned in at least one part of the peripheral wall of the receiving hole and resisting the surface contact card; and
   a shielding enclosure being disposed at one side of the housing, one part of the shielding enclosure exposed from the receiving hole and supporting the surface contact card;
   wherein the guiding element includes a first guiding flange, a second guiding flange and a third guiding flange, the guiding flanges are adjacent to each other and tilted with the peripheral wall and extend into the receiving hole, and
   wherein the shielding enclosure includes a cover and a plurality of flange edges perpendicularly bended downward therefrom.

2. The housing combination as claimed in claim 1, wherein the guiding element is made of metal, and is integrally formed with the housing by insert-molding.

3. The housing combination as claimed in claim 1, wherein the cover is recessed downward to form a support portion, the support portion being completely exposed from the receiving hole and supporting one part of the surface contact card.

4. A portable electronic device comprising:
   a housing defining a peripheral wall and a receiving hole, the receiving hole receiving a surface contact card;
   a guiding element being positioned at one part of the peripheral wall of the receiving hole and resisting the surface contact card, the guiding element includes a first guiding flange, a second guiding flange and a third guiding flange;
   a printed circuit board being positioned below the housing; and
   a shielding enclosure attached to the printed circuit board, the shielding enclosure including a cover and a plurality of flange edges perpendicularly bended downward therefrom, the cover being recessed downward to form a support portion, the support portion being completely exposed from the receiving hole and supporting the surface contact card, three connecting walls being connected the support portion to the cover, the three connecting walls resisting the guiding flanges.

5. The portable electronic device as claimed in claim 4, wherein the guiding element is made of metal, and is integrally formed with the housing by insert-molding.

6. The portable electronic device as claimed in claim 4, wherein the printed circuit board has a surface contact card connector that is coplanar with the support portion of the shielding enclosure and supporting the other part of the surface contact card.

7. The housing combination as claimed in claim 3, wherein three connecting walls are connected the support portion to the cover, the guiding element includes a first guiding flange, a second guiding flange and a third guiding flange, the three connecting walls resist the guiding flanges.

* * * * *